United States Patent
Storino et al.

Patent Number: 6,150,869
Date of Patent: Nov. 21, 2000

[54] METHOD AND APPARATUS FOR BODY CONTROL IN SILICON-ON-INSULATOR (SOI) DOMINO CIRCUITS

[75] Inventors: Salvatore N. Storino; Jeff V. Tran; Robert Russell Williams, all of Rochester, Minn.

[73] Assignee: International Business Machines Corporation, Armonk, N.Y.

[21] Appl. No.: 09/289,034

[22] Filed: Apr. 9, 1999

[51] Int. Cl.$^7$ ................................................. H03K 3/01
[52] U.S. Cl. ........................................... 327/534; 326/98
[58] Field of Search ............................. 326/98, 112, 121; 327/427, 534, 566

[56] References Cited

U.S. PATENT DOCUMENTS 5,917,365  6/1999  Houston ................................. 327/534
6,049,230  4/2000  Durham et al. ........................ 326/98

*Primary Examiner*—Jeffrey Zweizig
*Attorney, Agent, or Firm*—Joan Pennington

[57] ABSTRACT

Methods and apparatus are provided for body control in silicon-on-insulator (SOI) domino circuits. The silicon-on-insulator (SOI) domino circuit includes a clock input and an input transistor stack including a plurality of input transistors. Each of the plurality of input transistors receives a data input. An intermediate precharge node is connected to the input transistor stack. An output inverter is connected to the intermediate precharge node. The output inverter includes a pair of silicon-on-insulator (SOI) transistors. A clocked transistor is connected to a body of at least one of the pair of silicon-on-insulator (SOI) transistors. The clocked transistor predischarges the body of the SOI transistor. Another clocked transistor is connected between ground and a body of an evaluate transistor connected to the input transistor stack. The body of the evaluate transistor is predischarged by the clocked transistor.

16 Claims, 2 Drawing Sheets

METHOD AND APPARATUS FOR BODY CONTROL IN SILICON-ON-INSULATOR (SOI) DOMINO CIRCUITS

FIELD OF THE INVENTION

The present invention relates to methods and apparatus for body control in silicon-on-insulator (SOI) domino circuits.

DESCRIPTION OF THE RELATED ART

Silicon-on-insulator (SOI) technology is an enhanced silicon technology currently being utilized to increase the performance of digital logic circuits. Utilizing SOI technology designers can increase the speed of digital logic integrated circuits while reducing their overall power consumption. These advances in technology will lead to the development of more complex and faster computer integrated circuits that operate with less power.

Complementary metal oxide semiconductor (CMOS) compound domino logic (CDL) circuits or domino circuits are known. CMOS domino circuits provide a logical function, such as a NOR function or a NAND function, providing a logical output signal responsive to a plurality of input signals. Many domino circuits include a P-channel field effect transistor that is clocked to precharge an intermediate node causing the output to go to a predetermined logic state.

As shown in FIG. 1, SOI semiconductors include a thin layer of silicon placed on top of an insulator, such as silicon dioxide ($SiO_2$) or glass, and a MOS transistor built on top of this structure. The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed. With SOI technology faster MOS transistors can be manufactured resulting in higher performance semiconductors for faster electronic devices.

Referring to FIGS. 1 and 2, there is shown the SOI FET and the parasitic bipolar device. With SOI FETs, by placing a MOS transistor on top of a SOI layer, the MOS transistor is actually placed in parallel with a bipolar junction transistor, as illustrated in FIG. 2. If enough current is passed through the MOS transistor, the parasitic bipolar transistor will turn on. The parasitic bipolar transistor has a small current gain.

Normally, parasitic bipolar action does not manifest itself in conventional, bulk, NMOS transistors because the base of the bipolar transistor is always kept at ground potential, keeping the bipolar transistor turned off. In conventional, bulk, PMOS transistors the body of the PFET is tied to a supply rail Vdd. In the SOI FET, the body (B) of the MOS FET device, or base of the bipolar transistor, is floating and can be charged high by junction leakages induced when both drain (D) and source (S) terminals the MOS FET are at a high potential. Subsequently, if the source (S) is pulled to a low potential, the trapped charge in the base area (B) is available as parasitic base current. The parasitic base current activates the bipolar transistor and generates a collector current at the drain terminal of the MOS FET.

High speed CMOS circuits often employ a domino circuit technique that utilizes pre-charging to improve the gate speeds of the transistors. Circuit nodes are pre-charged during each clock cycle to a certain level.

A need exists to manage the body voltages of a simple SOI domino circuit to increase performance without increasing area.

SUMMARY OF THE INVENTION

A principal object of the present invention is to provide improved methods and apparatus for body control in silicon-on-insulator (SOI) domino circuits. Other objects are to provide such SOI domino circuits substantially without negative effects and that overcomes many of the disadvantages of prior art arrangements.

In brief, methods and apparatus are provided for body control in silicon-on-insulator (SOI) domino circuits. The silicon-on-insulator (SOI) domino circuit includes a clock input and an input transistor stack including a plurality of input transistors. Each of the plurality of input transistors receives a data input. An intermediate precharge node is connected to the input transistor stack. An output inverter is connected to the intermediate precharge node. The output inverter includes a pair of silicon-on-insulator (SOI) transistors. A clocked transistor is connected to a body of at least one of the pair of silicon-on-insulator (SOI) transistors. The clocked transistor predischarges the body of the SOI transistor.

In accordance with another feature of the invention, a clocked transistor is connected between ground and a body of an evaluate transistor connected to the input transistor stack. The body of the evaluate transistor is predischarged by the clocked transistor.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
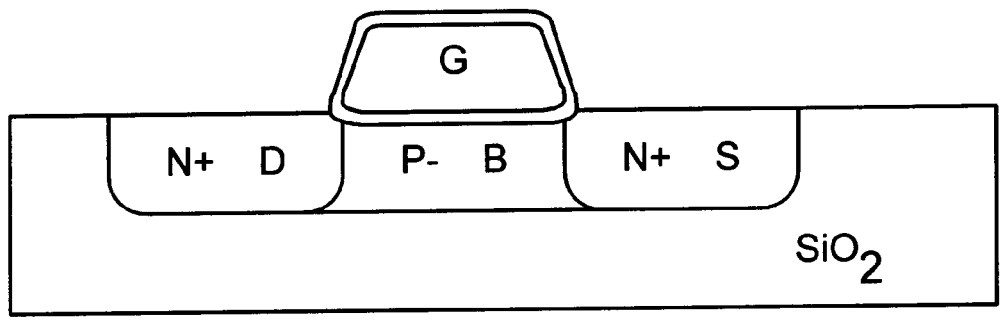
FIG. 1 a cross sectional view illustrating a conventional silicon-on-insulator (SOI) N-channel field effect transistor (NFET)
Figure 2:
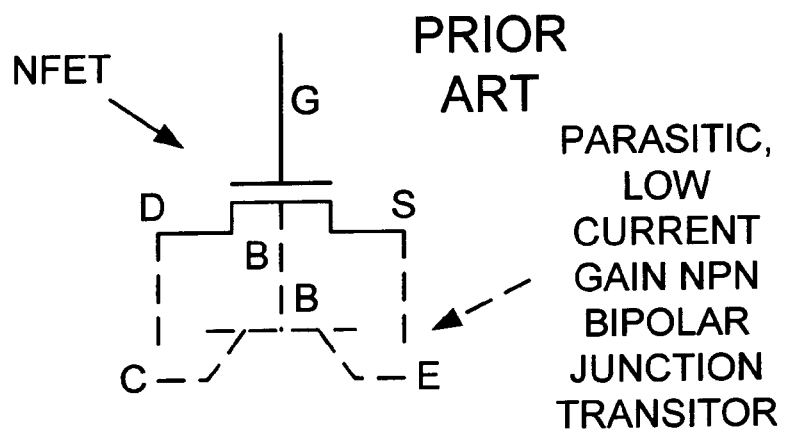
FIG. 2 is a schematic diagram illustrating the conventional silicon-on-insulator (SOI) N-channel field effect transistor (NFET) of FIG. 1 including a bipolar junction transistor.
Figure 3:
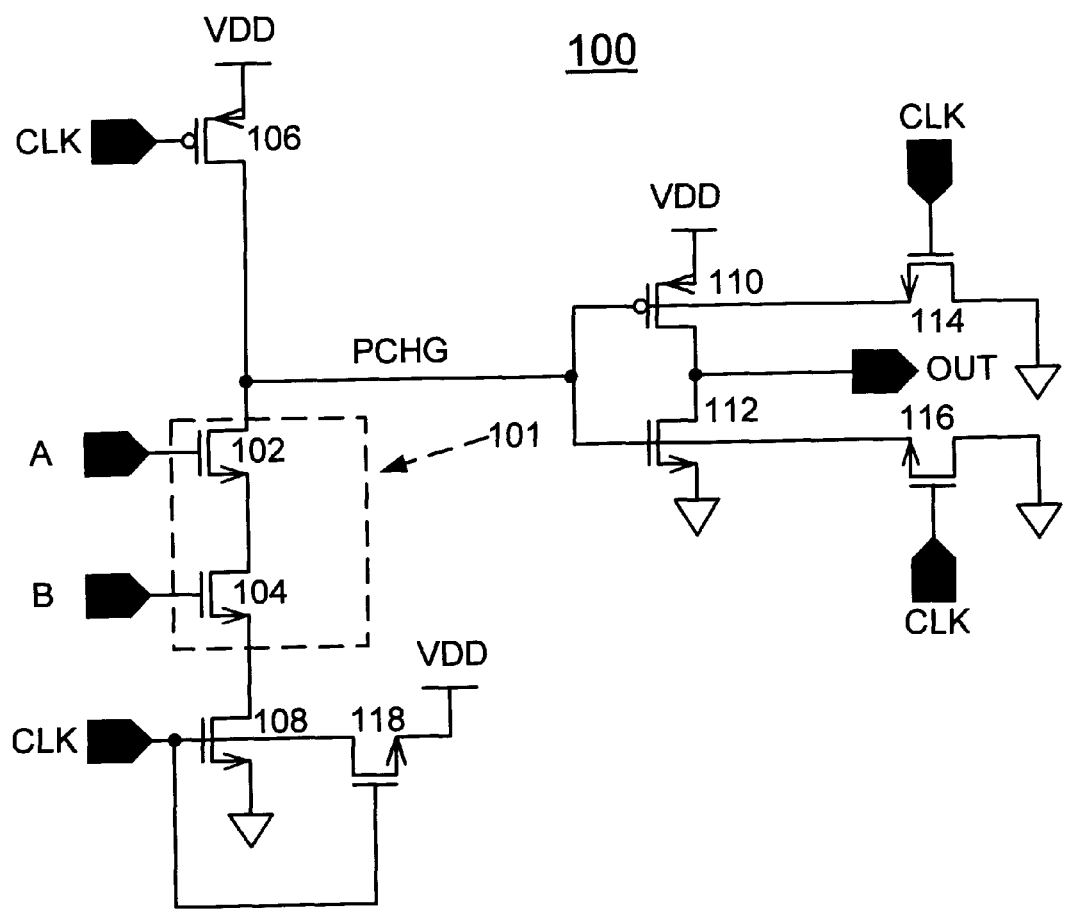
FIG. 3 is a schematic diagram illustrating a silicon-on-insulator (SOI) body controlled domino circuit of the preferred embodiment.

Having reference now to the drawings, in FIG. 3, there is shown a silicon-on-insulator (SOI) body controlled domino circuit generally designated by the reference character 100 of the preferred embodiment. As shown in FIG. 3, SOI body controlled domino circuit 100 includes an input transistor stack 101 of a pair of series connected input N-channel field effect transistors (NFETs) 102 and 104. A clocked precharge P-channel field effect transistor (PFET) 106 is connected between a supply voltage VDD and an intermediate precharge node labeled PCHG. The gate of PFET 106 is connected to the clock signal input. PFET 106 is turned on during the precharge mode by the low clock signal. PFET 106 is turned off during the evaluate mode by the high clock signal. The drain of input NFET 102 of input transistor stack 101 is connected to the intermediate precharge node PCHG. The source of NFET 102 is connected to the drain of NFET 104. The gate NFET 102 is connected to the input source A.

The gate NFET 104 is connected to the input source B. A clocked evaluate N-channel field effect transistor (NFET) 108 is connected between the source of NFET 104 at the bottom of the input transistor stack 101 and ground. The gate of NFET 108 is connected to the clock signal input. NFET 108 is turned on during the evaluate mode by the high clock signal. NFET 108 is turned off during the precharge mode by the low clock signal. The intermediate precharge node PCHG is connected to an inverter formed by a PFET 110 and a NFET 112 connected in series between the supply rail VDD and ground. An output of the SOI body controlled domino circuit 100 labeled OUT is provided at the connection of drains of PFET 110 and NFET 112. An optional weak feedback PFET can be used between nodes OUT and PCHG. The gate of optional feedback PFET is connected to node OUT. The drain of feedback PFET is connected to node PCHG and the source is connected to the supply voltage VDD.

In accordance with features of the present invention, SOI body control in the SOI body controlled domino circuit 100 is simple and easy to implement. In accordance with features of the present invention, an available SOI body terminal is conditionally charged high or low to enhance the current drive of the domino circuit 100.

In accordance with a first option of the preferred embodiment, the body of the output inverter PFET 110 is predischarged so that the threshold of the PFET 110 is lowered. A clocked NFET 114, used for predischarging the body of PFET 110, is connected between the body of the PFET 110 and ground. The NFET 114 is turned on during the evaluate mode by the high clock signal. NFET 114 is a small device, such as 1 micron, providing a weak conductance path between the body of the PFET 110 and ground. This gives an additional output current drive, for example of about 6 percent. Body control of the output inverter PFET 110 advantageously is chosen since the input noise margins on A and B domino gates of input NFETs 102 and 104 are unaffected. The current supplied by the parasitic PNP bipolar transistor associated with PFET 110 must be limited to avoid over driving NFET 112 and to avoid interfering with a required noise tolerance at node OUT. When node OUT is driving a dynamic load a lower noise tolerance is required than when node OUT is driving a static load.

In accordance with a second option of the preferred embodiment, the body of the output inverter NFET 112 is predischarged so that the threshold of the NFET 112 is raised. A clocked NFET 116, used for predischarging the body of NFET 112, is connected between the body of the NFET 112 and ground. The NFET 116 is turned on during the evaluate mode by the high clock signal. NFET 116 is a small device, such as 1 micron, providing a weak conductance path between the body of the NFET 112 and ground. This effectively raises the beta ratio of the inverter PFET 110, NFET 112 and effectively gives PFET 110 an additional current drive, for example of about 6 percent for monotonic rising edges. Similarly, body control the output inverter NFET 112 is chosen since the input noise margins on A and B inputs of input NFETs 102 and 104 are unaffected.

In accordance with a third option of the preferred embodiment, the body of the clocked NFET 108 is predischarged so that the threshold of NFET 108 is lowered, giving an additional current drive to the NFETs 102 and 104 which discharge the dynamic intermediate node PCHG faster. As a result, the rise time into the inverter PFET 110, NFET 112 is faster providing, an additional current drive of 6 percent. Again, the clock input of NFET 108 is chosen, since the input noise margins A and B inputs of input NFETs 102 and 104 are unaffected. A clocked NFET 118, used for predischarging the body of NFET 108, is connected between the body of the NFET 108 and the supply voltage VDD. The NFET 118 is turned on during the evaluate mode by the high clock signal. NFET 118 is a small device, such as 1 micron, providing a weak conductance path between the body of the NFET 108 and the supply voltage VDD.

This body control is not be applied on A and B inputs since the noise margin of input NFETs 102 and 104 would be lower. By clocking the body voltage utilizing any one or all of the NFETs 114, 116 and 118, the SOI body controlled domino circuit 100 recovers faster when restoring the PCHG node. For test mode, a series connected NFET can be used with NFETs 114, 116 and 118 to de-gate leakage currents.

In standard practice speeding up a circuit requires increasing device sizes. And if the size is increased the previous circuit is loaded, thus slowing it down and negating the performance increase. SOI body controlled domino circuit 100 of the preferred embodiment does not increase device sizes of NFETs 102, 104, 108, 112 and PFETs 106, 110. SOI body controlled domino circuit 100 provides a new way of adding performance to output states in SOI domino. SOI body controlled domino circuit 100 gives performance increase without an area penalty.

It should be understood that PFETs can be used with an inverted clock input instead of NFETs 114, 116, and 118. It should be understood also that another mechanism or device can be used for SOI body control instead of NFETs 114, 116, and 118.

It should be understood that principles of the present invention apply to domino logic circuits formed of PFETs.

While the present invention has been described with reference to the details of the embodiments of the invention shown in the drawing, these details are not intended to limit the scope of the invention as claimed in the appended claims.

What is claimed is:

1. Apparatus for body control in silicon-on-insulator (SOI) domino circuit comprising:

a clock input;

an input transistor stack including a plurality of input transistors, each of said plurality of input transistors receiving a data input;

an intermediate precharge node connected to said input transistor stack;

an output inverter connected to said intermediate precharge node; said output inverter including a pair of silicon-on-insulator (SOI) transistors;

a clocked transistor connected to a body of at least one of said pair of silicon-on-insulator (SOI) transistors; said clocked transistor receiving said clock input and predischarging said body of said at least one SOI transistor.

2. Apparatus for body control in silicon-on-insulator (SOI) domino circuit as recited in claim 1 wherein said pair of silicon-on-insulator (SOI) transistors of said output inverter include a SOI P-channel field effect transistor (PFET) and a SOI N-channel field effect transistor (NFET).

3. Apparatus for body control in silicon-on-insulator (SOI) domino circuit as recited in claim 2 wherein said SOI PFET and said SOI NFET are connected in series between a supply voltage and ground.

4. Apparatus for body control in silicon-on-insulator (SOI) domino circuit as recited in claim 2 wherein said clocked transistor connected to said body of at least one of said pair of silicon-on-insulator (SOI) transistors includes an N-channel field effect transistor (NFET), said NFET is connected between a gate of said SOI PFET and ground.

5. Apparatus for body control in silicon-on-insulator (SOI) domino circuit as recited in claim 2 wherein said clocked transistor connected to said body of at least one of said pair of silicon-on-insulator (SOI) transistors includes an N-channel field effect transistor (NFET), said NFET is connected between a gate of said SOI NFET and ground.

6. Apparatus for body control in silicon-on-insulator (SOI) domino circuit as recited in claim 2 wherein said clocked transistor connected to said body of at least one of said pair of silicon-on-insulator (SOI) transistors includes a pair of N-channel field effect transistors (NFETs), one said NFET is connected between a gate of said SOI PFET and ground, and another said NFET is connected between a gate of said SOI NFET and ground.

7. Apparatus for body control in silicon-on-insulator (SOI) domino circuit as recited in claim 1 wherein said clocked transistor connected to said body of at least one of said pair of silicon-on-insulator (SOI) transistors includes a small device providing a conduction path between said SOI body and ground.

8. Apparatus for body control in silicon-on-insulator (SOI) domino circuit as recited in claim 7 wherein said clocked transistor is approximately a one micron transistor device.

9. Apparatus for body control in silicon-on-insulator (SOI) domino circuit as recited in claim 1 wherein said clocked transistor is substantially smaller than said pair of SOI output inverter transistors.

10. Apparatus for body control in silicon-on-insulator (SOI) domino circuit as recited in claim 1 includes a silicon-on-insulator (SOI) evaluate device connected between said input transistor stack and ground.

11. Apparatus for body control in silicon-on-insulator (SOI) domino circuit as recited in claim 10 further includes a clocked transistor connected to a body of said silicon-on-insulator (SOI) evaluate device; said clocked transistor predischarging said body of said at least one SOI evaluate device.

12. Apparatus for body control in silicon-on-insulator (SOI) domino circuit as recited in claim 10 wherein said clocked transistor is a small transistor device.

13. Apparatus for body control in silicon-on-insulator (SOI) domino circuit as recited in claim 10 wherein said clocked transistor is smaller than said SOI evaluate device.

14. Apparatus for body control in silicon-on-insulator (SOI) domino circuit as recited in claim 10 wherein said clocked transistor is approximately a one micron transistor device.

15. A method for body control in silicon-on-insulator (SOI) domino circuit comprising the steps of:

connecting a small clocked transistor between a body of an output silicon-on-insulator (SOI) field effect transistor (FET) and ground; and applying a clock signal to said small transistor for predischarging said body of said output SOI FET.

16. A method for body control in silicon-on-insulator (SOI) domino circuit as recited in claim 15 further includes the steps of connecting a small clocked transistor to a body of an evaluate SOI FET, said evaluate SOI FET connected to an input transistor stack and applying a clock signal to said small transistor for predischarging said body of said evaluate SOI FET.

* * * * *